United States Patent [19]

Takeuchi et al.

[11] Patent Number: 4,982,354
[45] Date of Patent: Jan. 1, 1991

[54] DIGITAL FINITE IMPULSE RESPONSE FILTER AND METHOD

[75] Inventors: Sumitaka Takeuchi; Keisuke Okada, both of Hyogo, Japan

[73] Assignee: Mitsubishi Denki Kabushiki Kaisha, Tokyo, Japan

[21] Appl. No.: 204,956

[22] Filed: May 31, 1988

[30] Foreign Application Priority Data

May 28, 1987 [JP] Japan .................................. 62-135736

[51] Int. Cl.$^5$ ............................................. G06F 7/38
[52] U.S. Cl. ................................................ 364/724.16
[58] Field of Search .............. 364/602, 724.01, 724.16, 364/825; 379/411

[56] References Cited

U.S. PATENT DOCUMENTS

| | | | |
|---|---|---|---|
| 4,484,299 | 11/1984 | Rambourn et al. | 364/724.16 |
| 4,582,963 | 4/1986 | Danstrom | 379/411 |
| 4,691,293 | 9/1987 | Conboy | 364/724.16 |
| 4,791,596 | 12/1988 | Harbich | 364/724.16 |
| 4,803,648 | 2/1989 | Dierckx et al. | 379/411 |

FOREIGN PATENT DOCUMENTS 2104695 3/1982 United Kingdom ........... 364/724.16

OTHER PUBLICATIONS

Rabiner and Gold, *Theory and Application of Digital Signal Processing* (1975): 40, 51.

Primary Examiner—Dale M. Shaw
Attorney, Agent, or Firm—Lowe, Price, LeBlanc, Becker & Shur

[57] ABSTRACT

An input analogue signal is converted to a two-valued signal and then it is supplied to each encoder. Each gate signal forming circuit forms a gate signal based on an input digital signal. Each encoder encodes the above stated two-valued signal, an encoding function thereof being determined based on the above stated gate signal. As a result, each encoder outputs a result of multiplication of the two-valued signal and the digital signal in the form of a binary digital signal.

3 Claims, 5 Drawing Sheets

DIGITAL FINITE IMPULSE RESPONSE FILTER AND METHOD

BACKGROUND OF THE INVENTION

1. Field of the Invention

The present invention relates to a digital filter and particularly to a digital filter receiving an analogue signal as an input.

2. Description of the Prior Art

FIG. 1 is a block diagram showing a construction of a conventional finite impulse response (referred to hereinafter as FIR) type digital filer disclosed for example in "Theory and Application of Digital Signal Processing" by L. R. Rabiner and B. Gold, 1975, Prentice-Hall, Inc., pp. 40-51. An analogue signal inputted from an input terminal 1 is converted to a binary digital signal by an A-D converter 2. An output of the A-D converter 2 is supplied to a digital filter 3. The digital filter 3 comprises delay elements 4a to 4c, multipliers 5a to 5d and adders 6a to 6c so that multiplication and addition operations of digital signals are performed. The delay elements 4a to 4c delay the respective inputs thereof by one sample cycle, the delay elements 4a to 4c being connected dependently on the output of the A-D converter 2. The multipliers 5a, 5b, 5c and 5d receive, as a first input, the output of the A-D converter 2, an output of the delay element 4a, an output of the delay element 4b and an output of the delay element 4c, respectively, and receive, as a second input, digital signals A, B, C and D, respectively. The multipliers 5a to 5d each multiply the first and second inputs. Thus, if the above stated digital signals A, B, C and D are changed, filtering characteristics of the digital filter 3 can be changed. The adders 6a, 6b and 6c receive, as a first input, an output of the multiplier 5b, an output of the multiplier 5c and an output of the multiplier 5d, respectively, and receive, as a second input, an output of the multiplier 5a, an output of the adder 6a and an output of the adder 6b, respectively. The adders 6a to 6c each adds the first and second inputs, so that an output of the adder 6c is provided as an output of the digital filter 3.

In the example shown in FIG. 1, a transfer function H(z) of the digital filter 3 is represented by the below indicated equation (1).

$$H(z) = A + BZ^{-1} + CZ^{-2} + DZ^{-3} \quad (1)$$

where $Z^{-n}$ represents a delay in the "n"th sample cycle (n being an integer).

Assuming that an input data group X of the digital filter 3 is represented by the below indicated equation:

$$X = \{x(0), x(1), x(2), x(3), \ldots\},$$

an output data group Y is as follows:

$$\begin{aligned} Y = \{ & Ax(0) + Bx(-1) + Cx(-2) + Dx(-3), \\ & Ax(1) + Bx(0) + Cx(-1) + Dx(-2), \\ & Ax(2) + Bx(1) + Cx(0) + Dx(-3), \ldots \} \end{aligned}$$

As a result, z-transforms of the input data group X and the output data group are represented as follows:

$$\begin{aligned} X(z) = {} & x(0) + x(1)Z^{-1} + x(2)Z^{-2} + x(3)Z^{-3} + \ldots \\ Y(z) = {} & \{Ax(0) + Bx(-1) + Cx(-2) + Dx(-3)\} \\ & + \{Ax(1) + Bx(0) + Cx(-1) + Dx(-2)\}Z^{-1} \\ & + \{Ax(2) + Bx(1) + Cx(0) + Dx(-1)\}Z^{-2} \\ & \cdot \\ & \cdot \\ & \cdot \\ = {} & \{x(0) + x(1)Z^{-1} + x(2)Z^{-2} + \ldots\} \cdot H(z) \end{aligned}$$

Thus, a digital output according to the transfer function H(z) is obtained.

In the conventional digital filter thus constructed, the A-D converter 2 is required if the input signal is an analogue signal. Conventionally, the A-D converter 2 is provided on a chip different from that of the digital filter 3 and, accordingly, the size of the apparatus is increased. In addition, since the multipliers 5a to 5d multiply binary digital signals, they are formed by using full adders and, as a result, a carry delay occurs in the multipliers, which causes operation speed of the digital filter to be slow. Such problems become more serious according to increase of the number of bits of digital signals to be processed. In order to increase a multiplication speed, the multipliers may be formed as a pipeline. However, such method causes the construction of the apparatus to be further complicated and the size of the apparatus to be increased.

SUMMARY OF THE INVENTION

The present invention has been accomplished to solve the above described problems. Therefore, an object of the present invention is to provide a digital filter having a small size and capable of forming processing at high speed.

A digital filter in accordance with the present invention comprises: two-valued signal output means for sampling an analogue signal for a predetermined cycle and outputting a two-valued signal of a plurality of bits in which the number of successive logics "1" or "0" is changed in analogue correspondence with an amplitude of the analogue signal; digital signal input means for inputting a digital signal for setting filtering characteristics; gate signal generating means for generating a plurality of kinds of gate signals in association with the digital signal; a plurality of encoding means having a plurality of gate means to be controlled by the gate signals and adapted such that a function of encoding an output of the two-value signal output means is changed by control of the gate means, for outputting, in the form of a binary digital signal, a result of multiplication of the output value of the two-value signal output means by the digital signal; and arithmetic means having delay elements and addition elements located in association with an output of each encoding means, for performing predetermined arithmetic operation for the output of each encoding means. Thus, according to the present invention, analogue-to-digital conversion and multiplication processing are performed simultaneously in the encoding means.

According to the present invention, conversion from an analogue signal to a digital signal and multiplication processing are performed simultaneously by encoding processing, not by operation processing. Consequently, multiplication processing can be performed at a higher speed compared with a conventional digital filter and an operation speed of the digital filter of the present invention can be remarkably improved.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
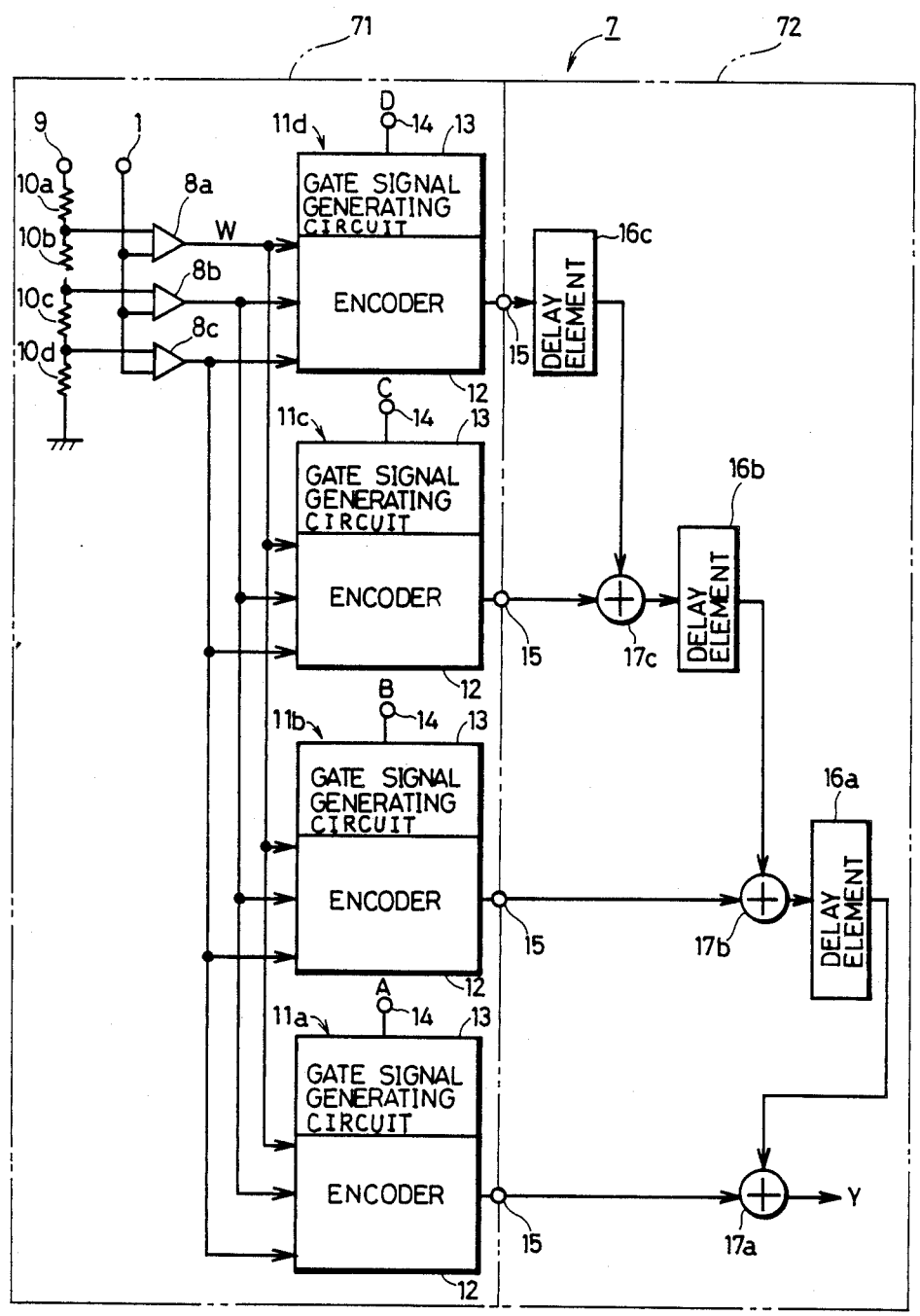
FIG. 2 is a schematic block diagram showing an embodiment of the present invention.

FIG. 2 is a schematic block diagram showing an embodiment of the present invention. A digital filter 7 mainly comprises an A-D converting portion 71 and a filter portion 72. The A-D converting portion 71 and the filter portion 72 are preferably formed on a single chip. The A-D converting portion 71 has not only an A-D converting function for converting an analogue signal to a binary digital signal but also a multiplication function. The filter portion 72 has a delay function and an addition function out of the delay processing and the multiplication and addition processing required in the digital filter.

First, the construction of the A-D converting portion 71 will be described. An analogue signal inputted to an input terminal 1 is applied to one input terminal of each of comparators 8a to 8c. A predetermined reference voltage is applied to a reference voltage input terminal 9. Voltage dividing resistors 10a to 10d are provided in series between the reference voltage input terminal 9 and the ground, so that a plurality of reference voltages of different levels are generated. Thus, reference voltage generating means is formed by the reference voltage input terminal 9 and the voltage dividing resistors 10a to 10d. A connection point of the voltage dividing resistors 10a and 10b is connected to another input terminal of the comparator 8a. A connection point of the voltage dividing resistors 10b and 10c is connected to another input terminal of the comparator 8b. A connection point between the voltage dividing resistors 10c and 10d is connected to another input terminal of the comparator 8c. Outputs of the comparators 8a to 8c are provided in parallel with encoders 12 of signal converting portions 11a to 11d, respectively. The signal converting portions 11a to 11d each comprise an encoder 12 and a gate signal generating circuit 13. A result of multiplication of an output value of each of the comparators 8a to 8c by a digital signal applied to a corresponding input terminal 14 is outputted in the form of a binary digital signal. The outputs of the signal converting portions 11a to 11d are supplied to the filter portion 72 through the respective output terminals 15.

Figure 1:
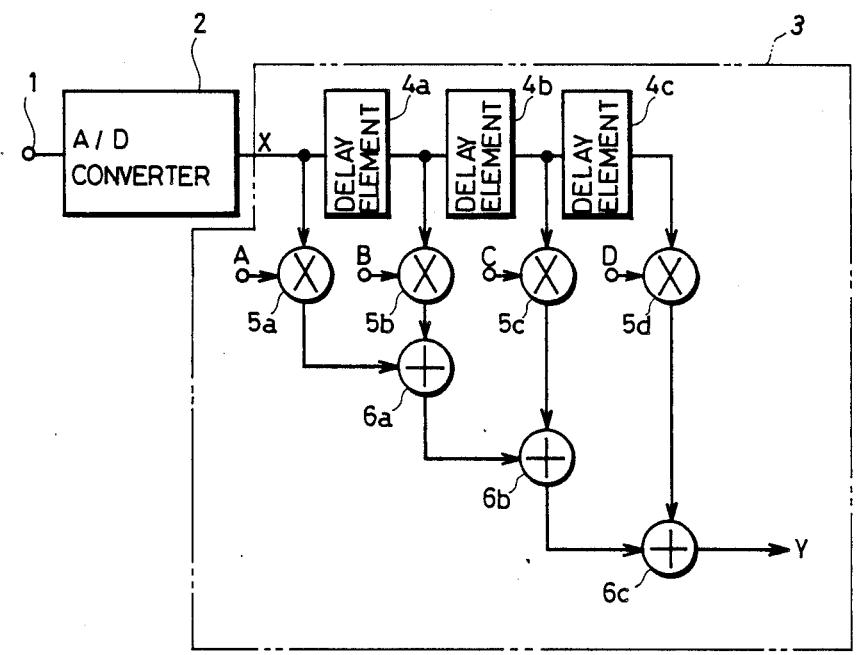
FIG. 1 is a block diagram showing an example of a conventional FIR type digital filter.
Figure 3:
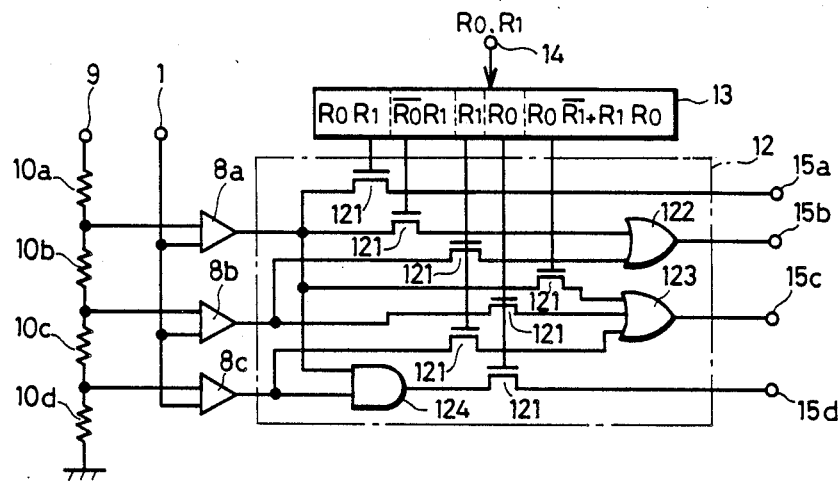
FIG. 3 is a circuit diagram showing details of the A-D converting portion 71 in FIG. 2.

FIG. 3 is a circuit diagram showing an example of construction of the signal converting portions 11a to 11d shown in FIG. 2. Since the constructions of the signal converting portions 11a to 11d are the same, FIG. 3 only shows the construction of one signal converting portion. Referring to FIG. 3, the encoder 12 comprises a plurality of transfer gates and logic gates. In the example of FIG. 3, the encoder 12 comprises seven transfer gates 121, a 2-input OR gate 122, a 3-input OR gate 123 and a 2-input AND gate 124. The encoder 12 encodes the outputs of the comparators 8a to 8c by means of those gate circuits and outputs a 4-bit digital signal to the output terminals 15a to 15d. Although only one output terminal 15 is shown for each of the signal converting portions 11a to 11d in FIG. 2 for simplification of the illustration, each output terminal 15 includes four output terminals 15a to 15d as shown in FIG. 3. The gate signal generating circuit 13 generates a plurality of kinds of gate signals (in this embodiment, five kinds of gate signals R0·R1, $\overline{R0}$·R1, R1, R0 and R0·$\overline{R1}$+R1·$\overline{R0}$) based on the 2-bit digital signals R0 and R1 applied to the input terminal 14. For this purpose, the gate signal generating circuit 13 includes logic circuits. The gate signal generating circuit may be formed by normal logic circuits or a programmable logic array (PLA). A gate signal generated in the gate signal generating circuit 13 is supplied to each transfer gate 121 of the encoder 12 to control turn-on and turn-off thereof. Thus, the encoding function in the encoder 12 is substantially controlled. As shown in FIG. 2, the gate signal generating circuits 13 of the signal converting portions 11a to 11d are supplied with A to D as the 2-bit digital signals R0 and R1. Those digital signals A to D are used for setting filtering characteristics, similarly to the digital signals A to D in FIG. 1. The digital signals A to D may be fixed or variable. If the digital signals A to D are variable, the digital filter is formed as a variable type digital filter capable of changing the filtering characteristics in an arbitrary manner.

Now, the construction of the filter portion 72 in FIG. 2 will be described. The respective output terminals 15 of the signal converting portions 11a to 11c are connected to input terminals of the adders 17a to 17c, respectively. The output terminal 15 of the signal converting portion 11d is connected to another input terminal of the adder 17c through the delay element 16c. An output of the adder 17c is supplied to another input terminal of the adder 17b through the delay element 16b. An output of the adder 17b is supplied to another input terminal of the adder 17a through the delay element 16a. An output of the adder 17a is provided as an output of the digital filter. Each of the delay elements 16a to 16c delays the input by one sample period.

Now, operation of the above described embodiment will be described.

First, operation of the A-D converting portion 71 will be described. The analogue signal inputted to the input terminal 1 is converted to for example a 3-bit two-valued signal through the comparators 8a to 8c. More specifically, the comparators 8a to 8c compare the reference voltages of the different levels supplied from the respective connection points of the voltage dividing resistors 10a to 10d with the level of the above mentioned analogue signal. If the analogue signal is larger than any of the reference voltages, an output of a high level (=1) is provided. Conversely, if each reference voltage is larger than the analogue signal, an output of a low level (=0) is provided. The comparators 8a to 8c have a function of sampling and holding the outputs in synchronism with clock pulses not shown. Accordingly, the comparators 8a to 8c sample the analogue signal for each cycle defined by the clock pulses and output the above described two-valued signal. It should be noted that the outputs of the comparators 8a to 8c are not binary-coded digital signals. The outputs of the comparators 8a to 8c are only those representing the amplitude of the analogue signal in an analogue manner. In other words, the outputs of the comparators 8a to 8c are signals in which boundary positions between 1 and 0 are changed dependent on the amplitude of the analogue signal. Processing for converting such two-valued signal to a binary digital signal, as well as predetermined multiplication processing, is performed in the signal converting portions 11a to 11d.

Figure 4:
FIG. 4 is an illustration showing output results of the circuits shown in FIG. 3 for explaining operation thereof.

Referring to FIG. 4, operation of the signal converting portions 11a to 11d will be described. It is now assumed that the outputs of the comparators 8a, 8b and 8c are 0, 1 and 1, respectively, and that the 2-bit digital input applied to the input terminal 14 is R0=R1=1. In this condition, the less significant two bits of the outputs of the comparators 8a to 8c are 1 and accordingly the outputs represent "2". On the other hand, since the digital input is binary-coded, it represents "3". The gate signal generating circuit 13 generates five kinds of gate signals R0·R1, $\overline{R0}$·R1, R1, R0 and R0·$\overline{R1}$+R1·$\overline{R0}$ with respect to the digital input (R0, R1). Those gate signals are used to control turn-on and turn-off of the transfer gate 121 in the encoder 12, thereby to substantially control the encoding function of the encoder 12. Thus, in the example shown in FIG. 4, the encoder 12 outputs "6" in the form of a binary digital signal as a result of multiplication of the output value=2 of the comparators 8a to 8c and the digital input=3, to the output terminals 15a to 15d. Thus, the A–D converting portion 71 has not only the normal A–D converting function but also the multiplication function.

Each encoder 12 comprises the plurality of gate circuits to perform the encoding function, i.e., the A–D converting function and the multiplication function by combinations of the respective gate processing operations. This is substantially different from the case shown in FIG. 1 in which the multipliers 5a to 5d perform processing by the plurality of full adders to fulfill the multiplication function. As is well known, switching operation in the gate circuits is performed very quickly. Accordingly, encoding processing in the encoder 12 is performed at a very high speed. In addition, any carry delay as in the multipliers 5a to 5d in FIG. 1 does not occur. If the number of bits of the two-valued signal to be processed is increased, there is no influence on the processing speed of the encoder 12. Further, the encoder 12 is capable of simultaneously performing the A–D converting processing and the multiplication processing, which were performed separately in the prior art. Consequently, since the A–D converting operation and the multiplication operation can be performed at high speed in this embodiment, operation speed can be considerably improved compared with that of a conventional digital filter.

In the above described embodiment, the A–D converting portion 71 and the filter portion 72 can be formed on the same chip and accordingly the apparatus size can be reduced. In addition, as shown in FIG. 2, the delay elements and the adders can be arranged regularly in the filter portion 72 and, as a result, the scale of integration can be increased.

In the following, the filtering function practically performed by the digital filter in the above described embodiment will be described. In the case of the embodiment shown in FIG. 2, the transfer function Hz of the digital filter 7 is represented by the following equation (2):

$$H(z) = A + BZ^{-1} + CZ^{-2} + DZ^{-3} \qquad (2)$$

where $Z^{-n}$ indicates a delay in the "n"th sample period.

Assuming that an output data group W of the comparators 8a to 8c is represented by the following equation:

$$W = \{W(0), W(1), W(2), W(3) \ldots\},$$

the encoder 12 encodes the outputs of the comparators 8a to 8c in response to the gate signal from the gate signal generating circuit 13 and outputs, in the form of a binary digital signal, a result of multiplication of the output value of the comparators 8a to 8c by the digital signal applied to the input terminal 14. As a result, output data groups as indicated below are obtained at the output terminals 15a to 15d of each encoder 12.

$$15a = \{AW(0), AW(1), AW(2), AW(3) \ldots\}$$

$$15b = \{BW(0), BW(1), BW(2), BW(3) \ldots\}$$

$$15c = \{CW(0), CW(1), CW(2), CW(3) \ldots\}$$

$$15d = \{DW(0), DW(1), DW(2), DW(3) \ldots\}$$

An output data group of the adder 17c is represented as follows:

$$17c = \{CW(0)+DW(-1), CW(1)+DW(0), CW(2)+DW(1) \ldots\}$$

Thus, addition is always performed with respect to a sample value delayed by one sample period. Similarly, an output data group of the adder 17b is represented as follows:

$$17b = \{BW(0)+CW(-1)+DW(2), BW(1)+CW(0)+DW(-1) \ldots\}$$

An output data group Y of the digital filter 7 is represented as follows:

$$\begin{aligned} Y &= 17a \\ &= \{AW(0) + BW(-1) + CW(-2) + DW(-3), \\ &\quad AW(1) + BW(0) + CW(-1) + DW(-2), \\ &\quad AW(2) + BW(1) + CW(0) + DW(-1) \ldots\} \end{aligned}$$

As a result, z-transforms of the input data group W and the output data group Y are represented as follows:

$$W(z) = W(0) + W(1)Z^{-1} + W(2)Z^{-2} + W(3)Z^{-3} + \ldots$$
$$Y(z) = \{AW(0) + BW(-1) + CW(-2) + DW(-3)\}$$
$$+ \{AW(1) + BW(0) + CW(-1) + DW(-2)\}Z^{-1}$$
$$+ \{AW(2) + BW(1) + CW(0) + DW(-1)\}Z^{-2}$$
$$\vdots$$
$$= \{W(0) + W(1)Z^{-1} + W(2)Z^{-2} + \ldots\}H(z)$$

Thus, a digital output according to the transfer function H(z) is obtained.

The above described embodiment is related with the case in which the input of the encoder 12 has three bits and the output thereof has four bits. However, the numbers of those bits may be changed arbitrarily.

In addition, the circuit configuration of the encoder of FIG. 3 is shown only by way of example. Other circuit configuration may be adopted insofar as the above described encoding function is fulfilled.

Furthermore, the gate signals generated in the gate signal generating circuit 13 shown in FIG. 3 are shown only by way of example. It goes without saying that the contents and the number of those gate signals differ dependent on change in the circuit configuration of the encoder 12.

Figure 5:
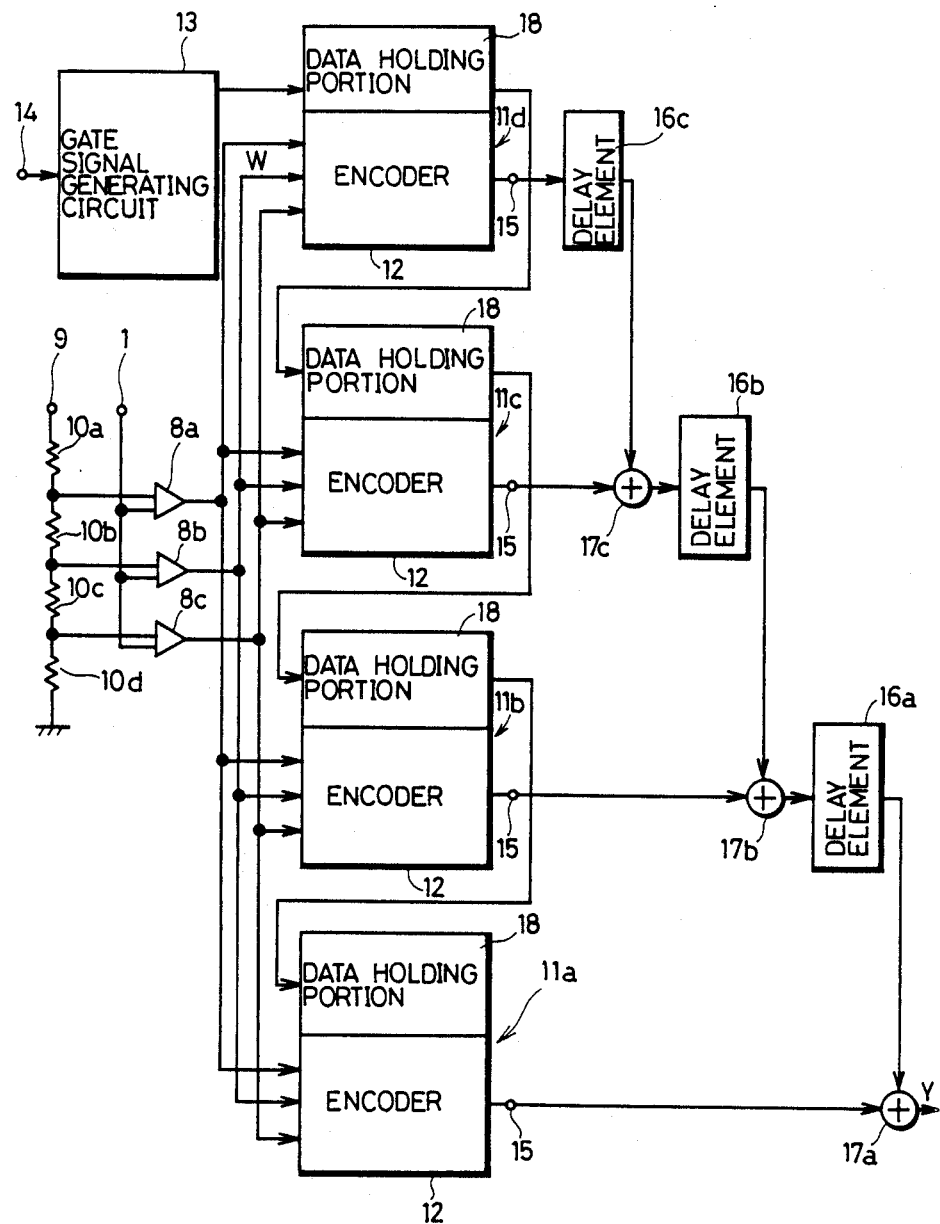
FIG. 5 is a schematic block diagram showing a construction of another embodiment of the present invention.

FIG. 5 is a block diagram showing a construction of another embodiment of the present invention. The embodiment in FIG. 5 is the same as the embodiment shown in FIG. 2, except for the below described points. The corresponding portions in FIG. 5 are denoted by the same reference numerals and description thereof is omitted. A characteristic feature of the embodiment of FIG. 5 is that only one gate signal generating circuit 13 is provided in common for the signal converting portions 11a to 11d. This gate signal generating circuit 13 generates gate signals successively based on digital signals A to D inputted successively from the input terminal 14 and outputs the gate signals serially. The signals converting portions 11a to 11d each have a data holding portion 18 formed by a shift register for example. The data holding portions 18 are connected in series to receive a gate signal from the gate signal generating circuit 13. Accordingly, the gate signals outputted serially from the gate signal generating circuit 13 are successively shifted in the data holding portions 18 and when the gate signal generating circuit 13 terminates output of a gate signal corresponding to a digital signal D, a specified gate signal is stored and held in each data holding portion 18. Thus, the same digital filtering function as in the embodiment shown in FIG. 2 can be performed. The above described embodiment shown in FIG. 5 has an advantage that the circuit configuration can be simplified compared with the embodiment shown in FIG. 2 because only one gate signal generating circuit 13 is provided in common for the signal converting portions 11a to 11d.

Figure 6:
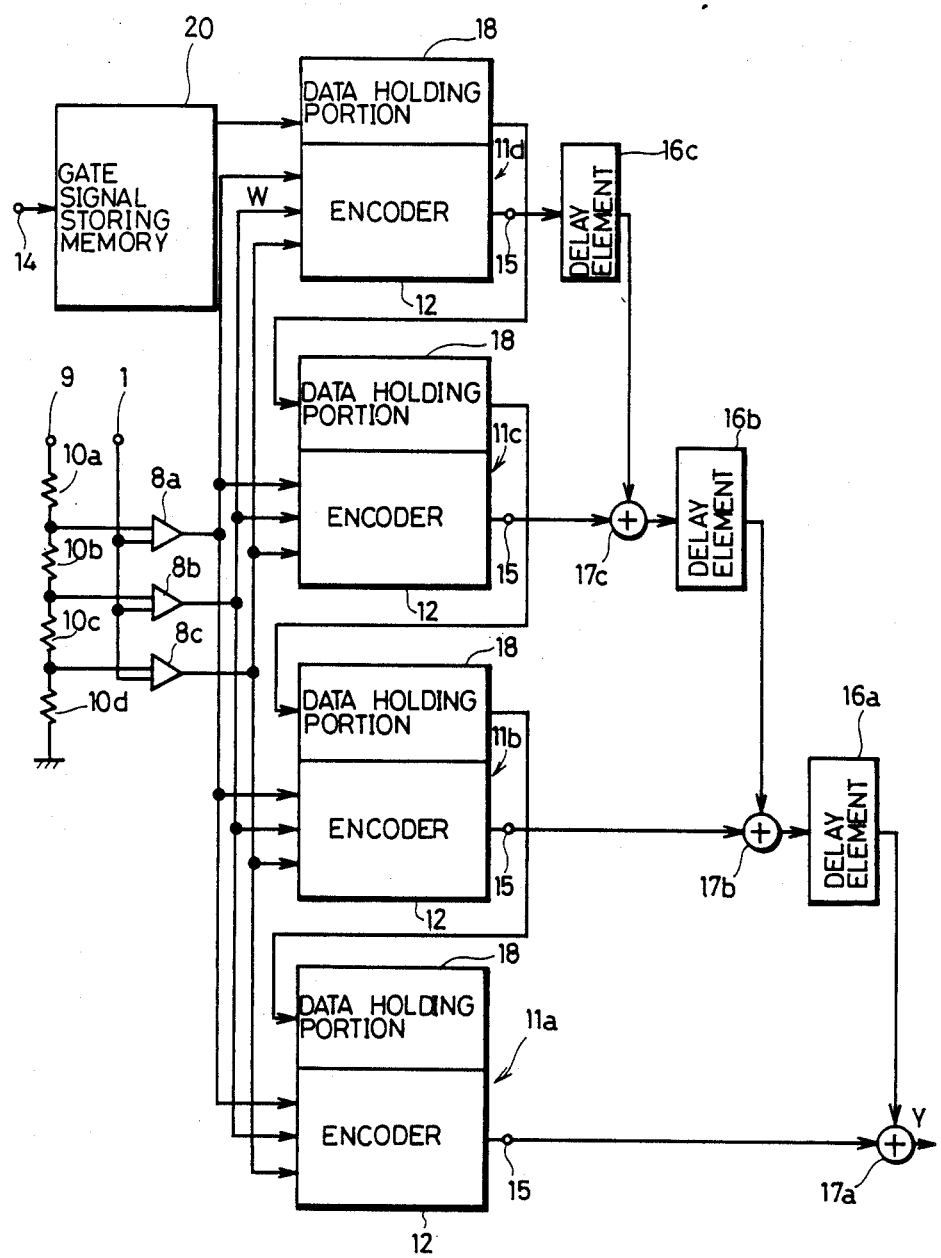
FIG. 6 is a schematic block diagram showing a construction of still another embodiment of the present invention.

FIG. 6 is a block diagram showing a construction of still another embodiment of the present invention. This embodiment shown in FIG. 6 has the same construction as that of the embodiment shown in FIG. 5 except for the below described points. The corresponding portions in FIG. 6 are denoted by the same reference numerals and description thereof is omitted. In the embodiment shown in FIG. 6, a gate signal storing memory 20 formed by a ROM for example is provided in place of the gate signal generating circuit 13 shown in FIG. 5. A plurality of groups of gate signals are stored in advance in the gate signal storing memory 20 corresponding to all the combinations of the digital signals inputted from the input terminal 14. The digital signals inputted from the input terminal 14 serve as an address signal of the gate signal storing memory 20. Consequently, when the digital signals are successively inputted from the input terminal 14, stored contents in the corresponding areas are serially read out from the gate signal storing memory 20 so as to be supplied to the data holding portions 18. Thus, this embodiment of FIG. 6 does not require such a gate signal generating circuit as used in the embodiments of FIGS. 2 and 5 and the circuit configuration can be further simplified.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A digital filter for receiving an analogue signal as an input, comprising:

conversion means for sampling said analogue signal and outputting a signal comprising a plurality of high level and low level bits, the number of successive bits of a given level corresponding to the magnitude of said analogue signal, digital signal input means for inputting a digital signal for setting filtering characteristics, gate signal generating means for generating a plurality of gate signals in response to said digital signal, a plurality of encoding means including a plurality of gate means controlled by said gate signals for encoding an output of said conversion means, said encoding means further comprising means for multiplying an output value of said conversion means by said digital signal to form a binary digital signal, and arithmetic operation means having delay elements and addition elements in response to the outputs of the respective encoding means, for performing predetermined arithmetic operation with respect to the outputs of the respective encoding means, wherein said gate signal generating means is only a single means provided in common for said respective encoding means and said gate signal generating means outputs said gate signals successively based on the digital signals inputted successively from said digital signal input means, said digital filter further comprising a plurality of data holding means provided corresponding to said respective encoding means, said data holding means being connected in a cascade to successively shift and hold the gate signals outputted successively from said signal generating means.

2. A digital filter in accordance with claim 1, wherein said gate signal generating means is a gate signal generating circuit including a predetermined logic circuit.

3. A digital filter in accordance with claim 1, wherein said gate signal generating means is storing means for storing a plurality of groups of gate signals in advance, and the digital signals inputted successively from said digital signal input means are supplied to said storing means as address signals for addressing of said storing means.

* * * * *